(12) United States Patent
Rachbauer et al.

(10) Patent No.: US 10,240,229 B2
(45) Date of Patent: Mar. 26, 2019

(54) MO—SI—B LAYERS AND METHOD FOR THE PRODUCTION THEREOF

(71) Applicant: Oerlikon Surface Solutions AG, Pfaffikon, Pfaffikon SZ (CH)

(72) Inventors: Richard Rachbauer, Feldkirch (AT); Mirjam Arndt, Bad Ragaz (CH); Paul Heinz Mayrhofer, Neckenmarkt (AT); Peter Polcik, Reutte (AT); Annika Vieweg, Leoben (AT); Jiri Kalas, Amden (CH); Helmut Riedl, Kirchberg/Walde (AT)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 15/311,904

(22) PCT Filed: May 26, 2015

(86) PCT No.: PCT/EP2015/061600
§ 371 (c)(1),
(2) Date: Nov. 17, 2016

(87) PCT Pub. No.: WO2015/181176
PCT Pub. Date: Dec. 3, 2015

(65) Prior Publication Data
US 2017/0088939 A1    Mar. 30, 2017

Related U.S. Application Data

(60) Provisional application No. 62/051,475, filed on Sep. 17, 2014.

(30) Foreign Application Priority Data

May 26, 2014   (DE) .................. 10 2014 007 589

(51) Int. Cl.
B21D 37/01   (2006.01)
C09D 1/00   (2006.01)
(Continued)

(52) U.S. Cl.
CPC ............ *C23C 14/352* (2013.01); *B21D 22/00* (2013.01); *B21D 37/00* (2013.01); *B21D 37/01* (2013.01);
(Continued)

(58) Field of Classification Search
None
See application file for complete search history.

(56) References Cited

U.S. PATENT DOCUMENTS

2004/0219295 A1   11/2004   Perepezko

FOREIGN PATENT DOCUMENTS

WO   2012/104048 A1   8/2012

OTHER PUBLICATIONS

Lange, et al., "Oxidation Behavior of Magnetron Sputtered Double Layer Coatings Containing Molybdenum, Silicon and Boron", Intermetallics, Elsevier Science Publishers B.V., GB, vol. 48, Oct. 1, 2013, pp. 19-27.
(Continued)

*Primary Examiner* — Colin W. Slifka
(74) *Attorney, Agent, or Firm* — Pearne & Gordon LLP

(57) ABSTRACT

The present invention concerns substrates coated with an $Mo_{1-x-y}Si_xB_y$ layer, said layer comprising the T2 phase, and a method for the production thereof.

4 Claims, 10 Drawing Sheets

(51) Int. Cl.
  *C23C 14/06* (2006.01)
  *C23C 14/34* (2006.01)
  *C23C 14/35* (2006.01)
  *C23C 14/58* (2006.01)
  *C23C 14/00* (2006.01)
  *B21D 22/00* (2006.01)
  *B21D 37/00* (2006.01)

(52) U.S. Cl.
  CPC ............ *C09D 1/00* (2013.01); *C23C 14/0036* (2013.01); *C23C 14/067* (2013.01); *C23C 14/0682* (2013.01); *C23C 14/3485* (2013.01); *C23C 14/5806* (2013.01)

(56) References Cited

OTHER PUBLICATIONS

Perepezko, et al., "Environmental Resistance of Mo—Si—B Alloys and Coatings", Oxidation of Metals, Springer New York LLC, US. vol. 80, No. 3, Feb. 12, 2013, pp. 207-218.

Tang, et al., "Characterization and Oxidation Behavior of Silicide Coating on Multiphase Mo—Si—B Alloy", Intermetallics, Elsevier Science Publishers B.V., GB, vol. 16, No. 9, Aug. 15, 2008, pp. 1125-1133.

International Search Report for PCT/EP2015/061600 dated Sep. 2, 2015.

FIG. 2

Aim of this Study

☐ Explore Mo-rich area of the ternary system Mo-Si-B for PVD processed $Mo_{1-x-y}Si_xB_y$ coatings concerning following properties:
- Phase stability ($T_2$ Phase – $Mo_5SiB_2$)
- Mechanical properties
- Thermal stability
- Oxidation resistance ☐ Verification of oxidation kinetics obtained for bulk materials compared to thin films

Deposition parameters

☐ AJA Orion 5 with Load Lock system

☐ 2 different target set up were used
- $Mo_{1-x}Si_x$ compound targets + pure B
- Elemental Mo, Si, and B targets ☐ $P_{total} = 1 \cdot 10^{-2}$ mbar in pure Ar atmosphere
☐ $T_{dep} = 500°C$, Floating, substrate rotation of 1 Hz
☐ $P_{MoSi} = 250$ W ➔ DC sputtering
☐ $P_{Si} \leq 200$ W ➔ DC pulse mode (f = 150 kHz, τ = 1256 ns)
☐ $P_B \leq 250$ W ➔ DC pulse mode (f = 150 kHz, τ = 1256 ns)

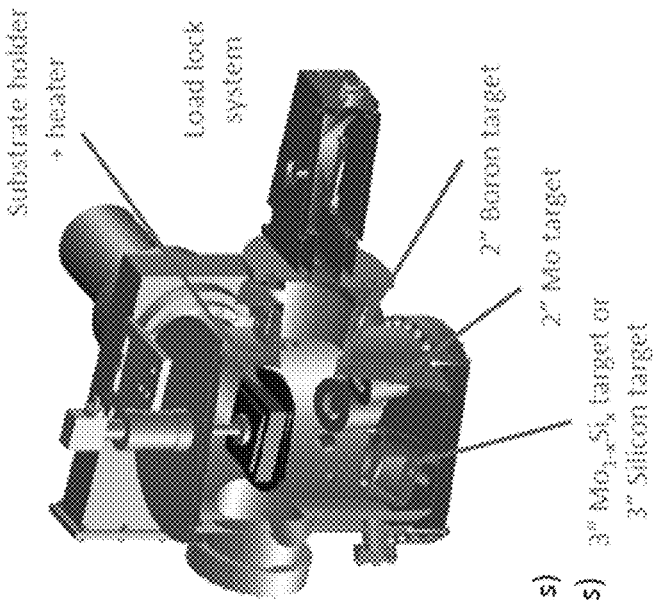

Substrate holder + heater
Load lock system
2" Boron target
2" Mo target
3" $Mo_{1-x}Si_x$ target or 3" Silicon target

FIG. 9

*Mechanical properties and phase stability*

- Through the deposition process Boron is incorporated as a Mo-B based phases into the coatings ➔ no ternary $Mo_{1-x-y}Si_xB_y$ structures are obvious in the as deposited state
- Increased Boron content leads to grain refinement and XRD amorphous structures
- Phase stability of $Mo_{1-x-y}Si_xB_y$ coatings show good agreement to other literature reports
- Above alloying contents of Si ≥ 7.6 at.% and Si+B ≥ 5.0 at.% all coatings exhibit hardness values in the range of 20 GPa

*Thermal stability*

- Hardness increases during annealing due to the formation of $T_1$ and $T_2$ structured $Mo_{1-x-y}Si_xB_y$ ➔ $T_a$ = 900°C up to 27 GPa
- Recrystallization leads to decreased mechanical properties at $T_a$ = 1100°C and 1300°C

*Oxidation resistance*

- Oxidation resistance is closely linked to the B/Si ratio as well as related to a certain Si content
- $Mo_{0.58}Si_{0.28}B_{0.14}$ (B/Si = 0.5) performs best over investigated temperature range ➔ At $T_{ox}$ = 1300°C less than 10% of the coating thickness is oxidized

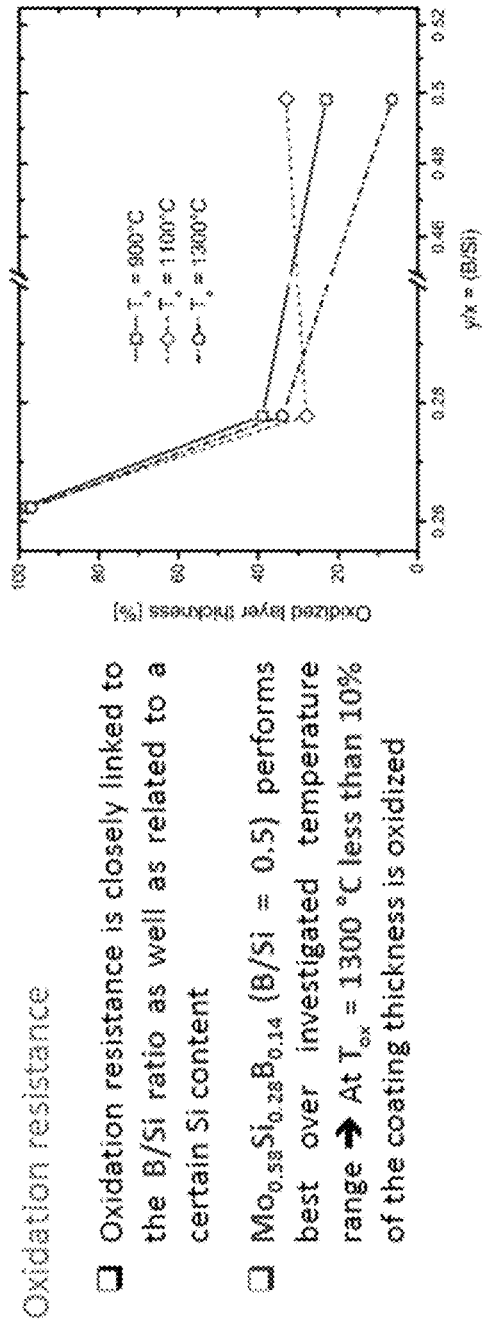

MO—SI—B LAYERS AND METHOD FOR THE PRODUCTION THEREOF

The present invention relates to Mo—Si—B layers with very good layer properties, in particular with respect to mechanical properties, resistance to oxidation and generally thermal stability at high temperatures (even 900° C. and higher).

The present invention relates in particular to substrates resp. components or tools with a $Mo_{1-x-y}Si_xB_y$ layer, wherein the layer comprises the T2 phase, and methods for the production thereof.

Thanks to the exceptional properties of the Mo—Si—B layers according to the present invention, these layers are suitable in particular for coating components and tools that are used at high temperatures.

The Mo—Si—B layers according to the present invention can be well suited in particular for forming tools for hot forming, such as for example hot stamping.

According to a preferred embodiment of the present invention, the Mo—Si—B layers are deposited on tool surfaces that are subjected during use to high temperatures.

The Mo—Si—B layers according to the present invention and according to the above mentioned preferred embodiment can according to the invention be produced and/or made available as follows:

1. the Mo—Si—B layers can be deposited for example by means of PVD sputtering from separate Mo, Si and B targets or by means of PVD sputtering of Mo—Si composite targets and B targets in a reactive atmosphere containing nitrogen in such a way that the Mo—Si—B layers do not comprise any ternary $Mo_{1-x-y}Si_xB_y$ based phase, then the tools coated with the Mo—Si—B layers are used at high temperatures, whereby at least a ternary $Mo_{1-x-y}Si_xB_y$ based phase (e.g. the T2 phase and/or the T1 phase) is formed in the Mo—Si—B layers;

or 2. the Mo—Si—B layers can be deposited in a similar manner as described above under point 1 onto the tool surfaces, but before the tools are used, at least the surfaces coated with the Mo—Si—B layers are subjected to a heat treatment (e.g. a heat treatment in a vacuum atmosphere), in order to form at least a ternary $Mo_{1-x-y}Si_xB_y$ based phase in the Mo—Si—B layers before the tools coated with Mo—Si—B layers are used at high temperatures;

or 3. the Mo—Si—B layers can also be deposited in such a way that immediately after the deposition e.g. by means of PVD arc evaporation of Mo—Si—B composite targets or by means of PVD sputtering and/or HiPIMS (high-power impulse magnetron sputtering) of Mo—Si—B composite targets in a reactive atmosphere containing nitrogen, the Mo—Si—B layers have at least a ternary $Mo_{1-x-y}Si_xB_y$ based phase before the tools coated with Mo—Si—B layers are used at high temperatures.

Refractory metals, such as Mo, Ta or W, have the highest melting points among all pure elements and are thus very interesting especially for high temperature applications.

For such application, both the properties of the basis material at high temperatures as well as a thermally stable protective coating are important. One of these systems, which is attracting more and more interest in the field of high temperature research, is constituted by molybdenum alloys. Although molybdenum has a very high melting point (Tm=2623° C.), the poor resistance to oxidation at temperatures above 400° C. limits its use. High temperatures result in an evaporation of the oxide ($MoO_3$) and a drastic loss in mass. Alloying silicon increases the temperature resistance of molybdenum at high temperatures, since it results in the formation of a protective $SiO_2$ layer. In order to protect the alloy also at low temperatures, boron is alloyed in, which under oxidative atmosphere forms a glass-like $B_2O_3$ layer.

The resistance to oxidation is influenced to a high degree by the phases that have been previously set in the system. The most important phases in the three-phase system $Mo_{1-x-y}$—$Si_x$—$B_y$, are the binary phases $Mo_3Si$ (A15, cP8, $Cr_3Si$ prototype), $Mo_5Si_3$ (D8m, t132, $W_5Si_3$ prototype), $MoSi_2$(C11, t16, $MoSi_2$ prototype) and the so-called T2 phase ($Mo_5SiB_2$ (T2, I4/mcm, $Cr_5B_3$ prototype)). The proportion of the T2 phase strongly influences the resistance to oxidation, but the latter must be adjusted by additional prior treatment, e.g. vacuum annealing.

In this work, layers with different chemical compositions $Mo_{1-x-y}Si_xB_y$ were prepared by PVD magnetron sputtering and both their structural and mechanical properties were investigated. By means both of three elementary targets as well as of a Mo—Si composite target and an elementary Boron target, various compositions could be adjusted. Directly after the coating, no T2 phase could be detected in any of the compositions, only the above-mentioned binary phases (mainly $Mo_5Si_3$ (D8m) and $Mo_3Si$ (A115)) were present. With increasing boron content, an XRD of amorphous structure in particular was found. The hardness of the produced layers showed an increase of about 20 GPa, with more than 5 at % of silicon and boron, with increasing alloy content. By heat-treating the layers in vacuum at 900° C., 1100° C. and 1300° C., their thermal stability and phase development were investigated. Already at 900° C., the desired T2 phase occurred and crystallization in the XRD amorphous layers. Subsequently, there was no further change in the structures. The hardness of the layers showed a further increase for all B/Si ratios as a result of the heat treatment. In particular, the $Mo_{0.53}Si_{0.37}B_{0.10}$ layer shows a maximum hardness of 26 GPa due to the formation of the T2 phase. Oxidation experiments for one hour at 900° C., 1100° C. and 1300° C. showed excellent resistance to oxidation of the layers across a wide composition range with different B/Si ratios.

XRD analyzes show that the T2 phase also forms during the oxidation experiments at high temperatures, especially in the most resistant layers. By means of EDX line scans, the respective remaining layer thicknesses were determined and the layer with the highest B/Si ratio (Mo0.58Si 0.28B0.14) proved to be the layer with the best properties. This chemical composition had hardly any loss of layer thickness due to oxidation, as well as a T2 structure after oxidation.

In this study, already existing theories about the influence of the B/Si ratio on the resistance to oxidation could be confirmed experimentally. However, it was also possible to further show that a preliminary heat treatment is not necessary in thin layers in order to adjust a T2 phase. This forms sufficiently rapidly in an oxidation treatment to enable a protective oxide layer.

Hereinafter, some experiments and analyses are represented in FIGS. 1 to 10 which should help in better understanding the invention.

FIG. 2 shows a coating setup for the production of Mo—Si—B layers according to the present invention according to a first example:

The $Mo_{1-x-y}Si_xB_y$ layers were produced with the following coating parameters:

Coating pressure $p_{TOTAL}=1.10^{-2}$ mbar in an essentially pure argon atmosphere Coating temperature $T_{dep}=500°$ C.

Sputter output at the Mo—Si Target $P_{MoSi}=250$ W←DC sputtering

Sputter output at the Si Target $P_{Si}\leq 200$ W←DC pulsed (f=150 kHz, τ=1256 ns)

Sputter output at the B Target $P_B=250$ W←DC pulsed (f=150 kHz, τ=1256 ns)

The aim was to examine the phase stability, mechanical properties, thermal stability and resistance to oxidation.

Figure 1:
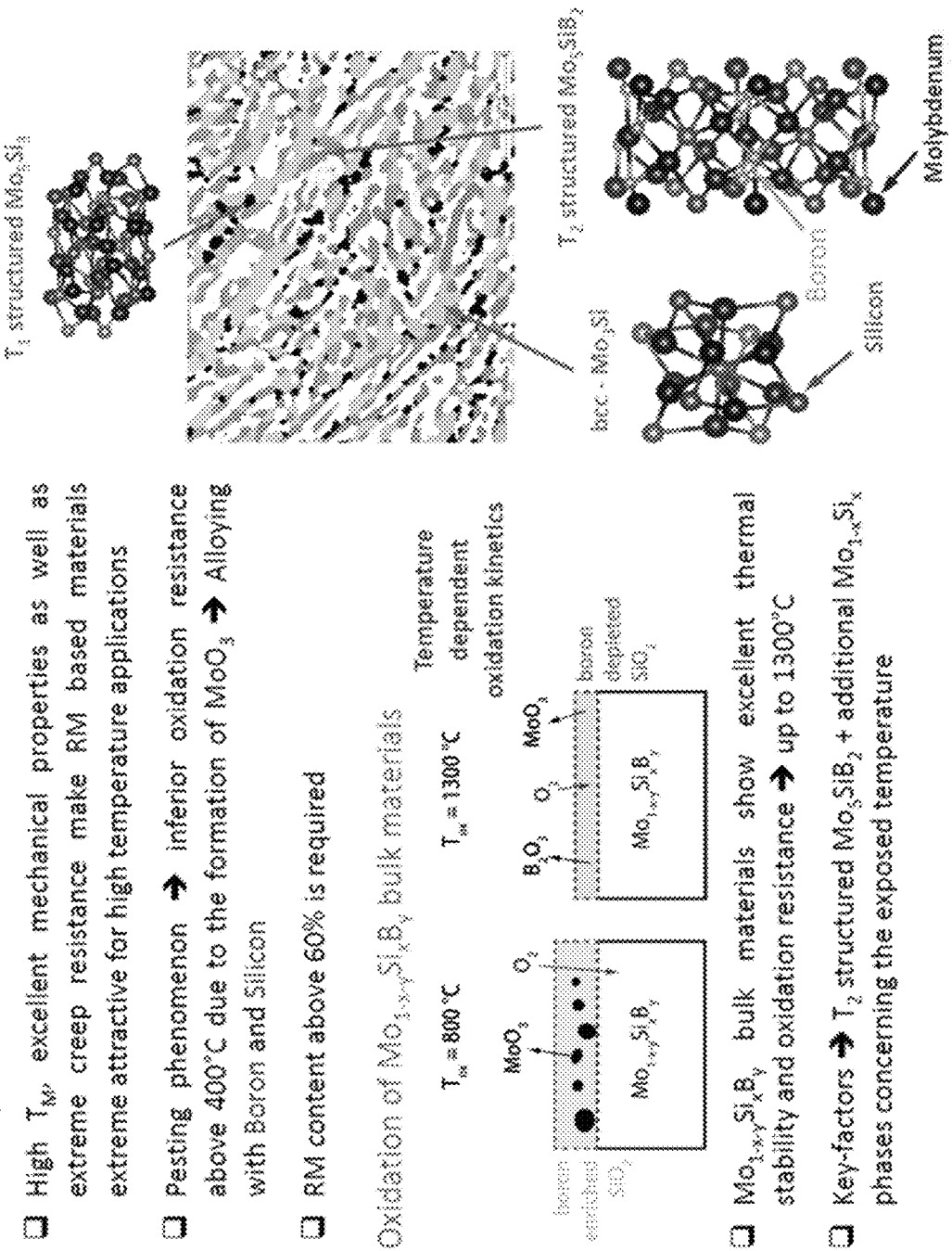
FIG. 1 shows the oxidation mechanism $Mo_{1-x-y}Si_xB_y$ (basis material).
Figure 3:
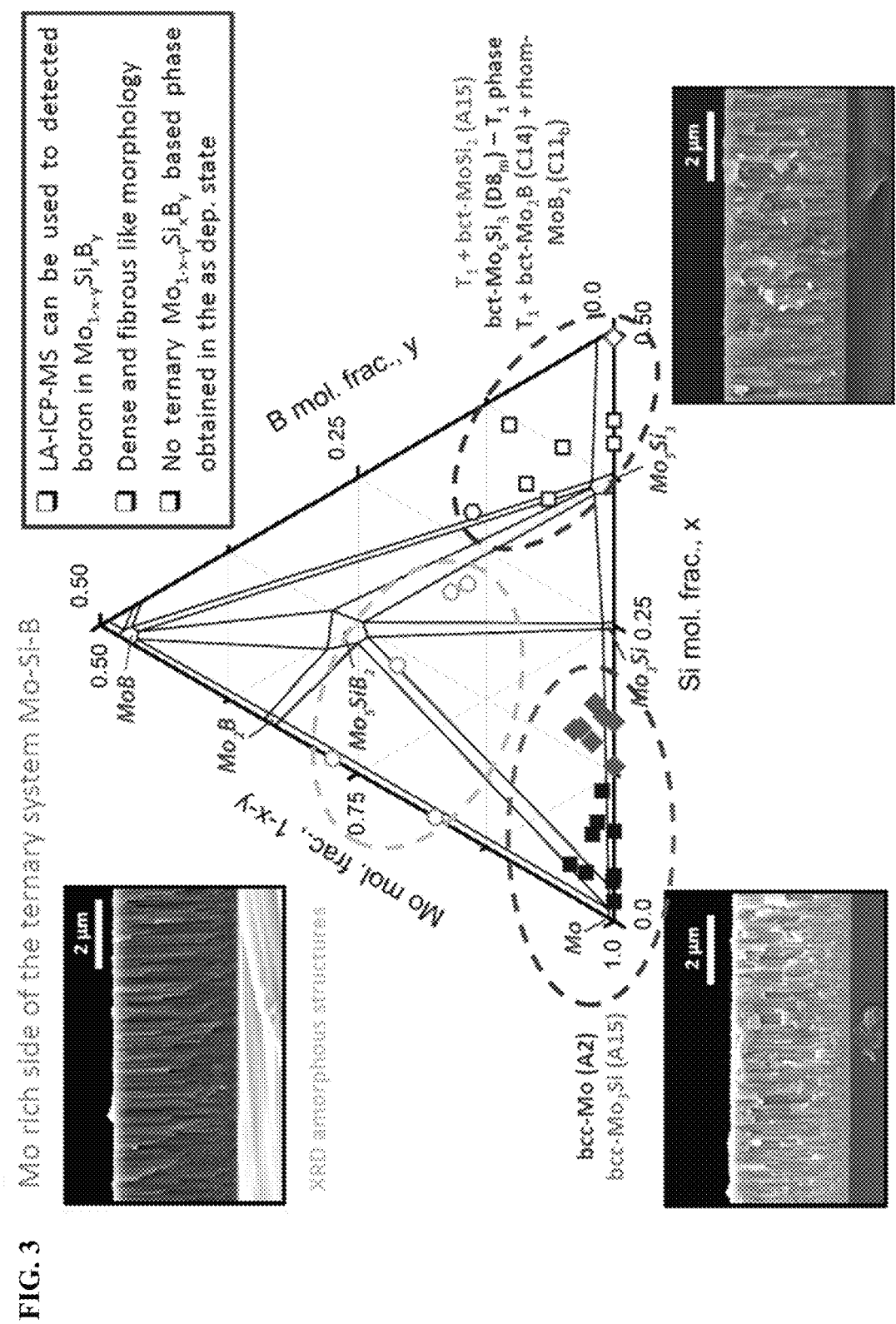

FIG. 3 shows the structure and morphology of the deposited $Mo_{1-x-y}Si_xB_y$ layers.

Figure 4:
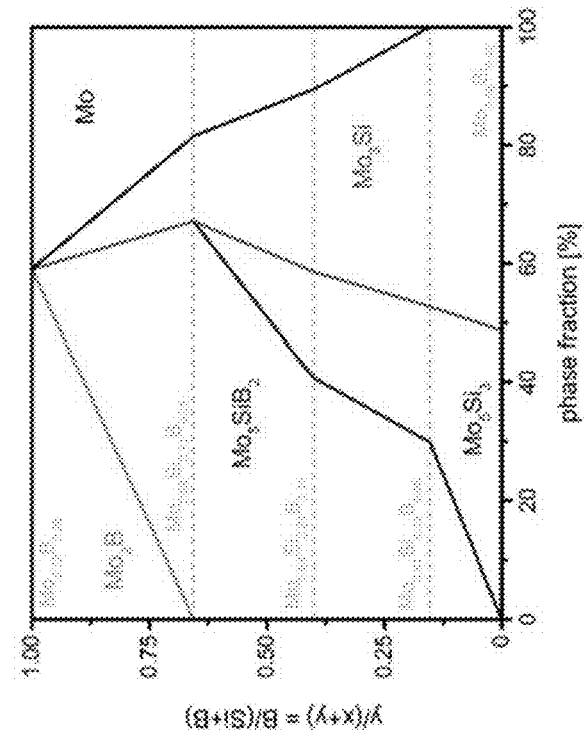

FIG. 4 shows the analysis of the phase stability of the deposited $Mo_{1-x-y}Si_xB_y$ layers.

Figure 5:
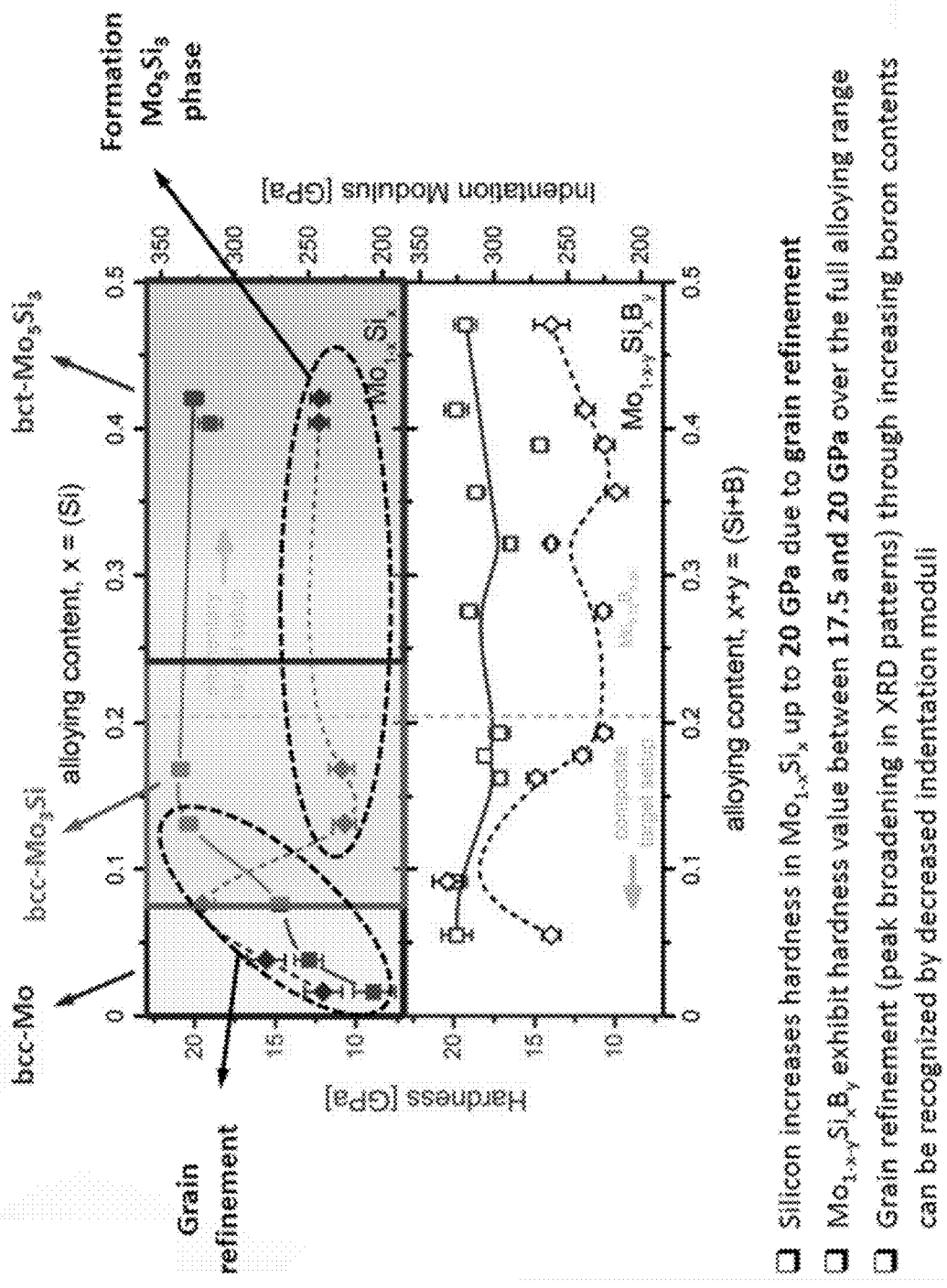

FIG. 5 shows the analysis of the mechanical properties of the deposited $Mo_{1-x-y}Si_xB_y$ layers.

Figure 6:
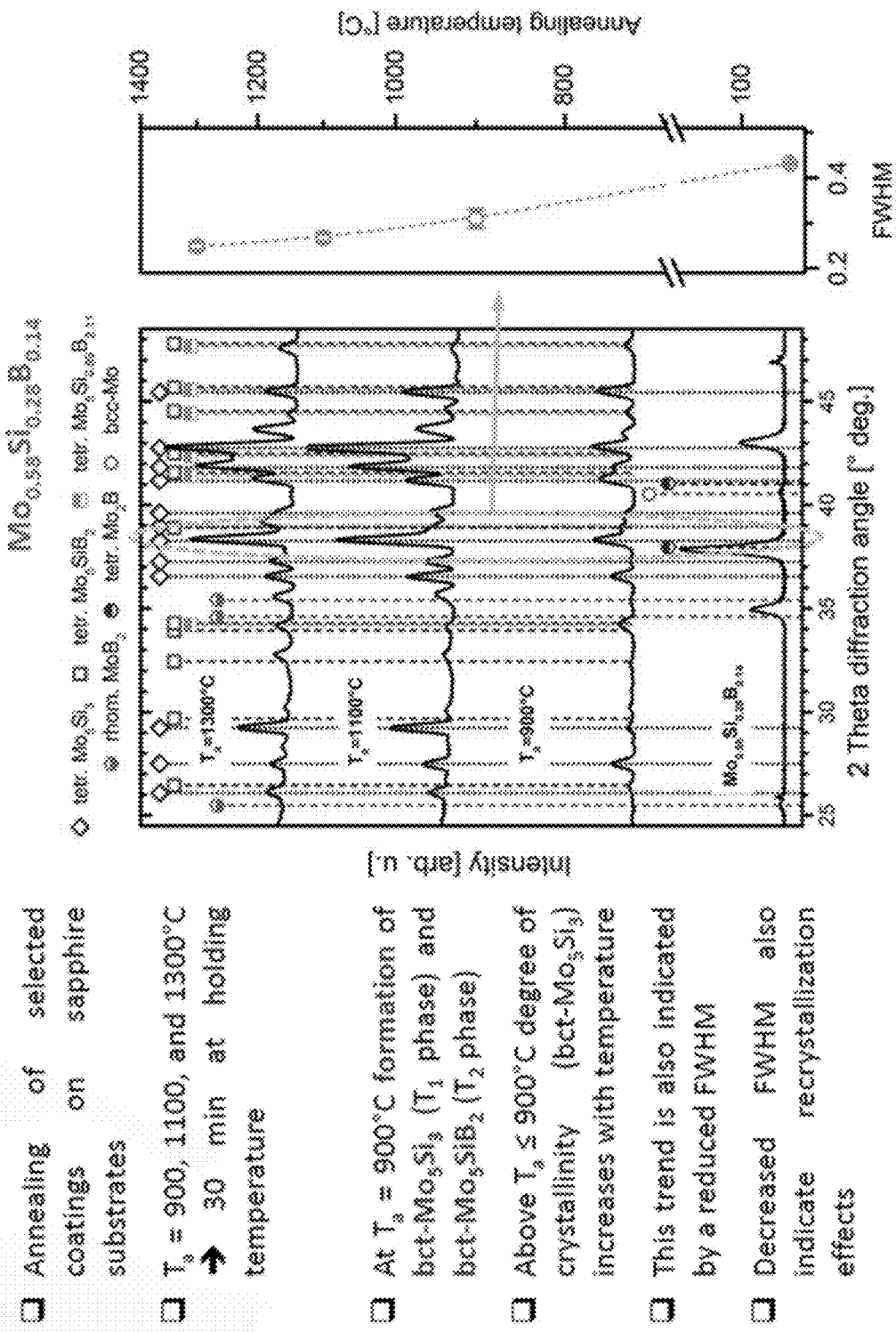

FIG. 6 shows the analysis of the phase transformation of the deposited $Mo_{1-x-y}Si_xB_y$ layers, in particular using the example of $Mo_{0.58}$—$Si_{0.28}$—$B_{0.14}$, during heat treatments in a vacuum atmosphere.

Figure 7:
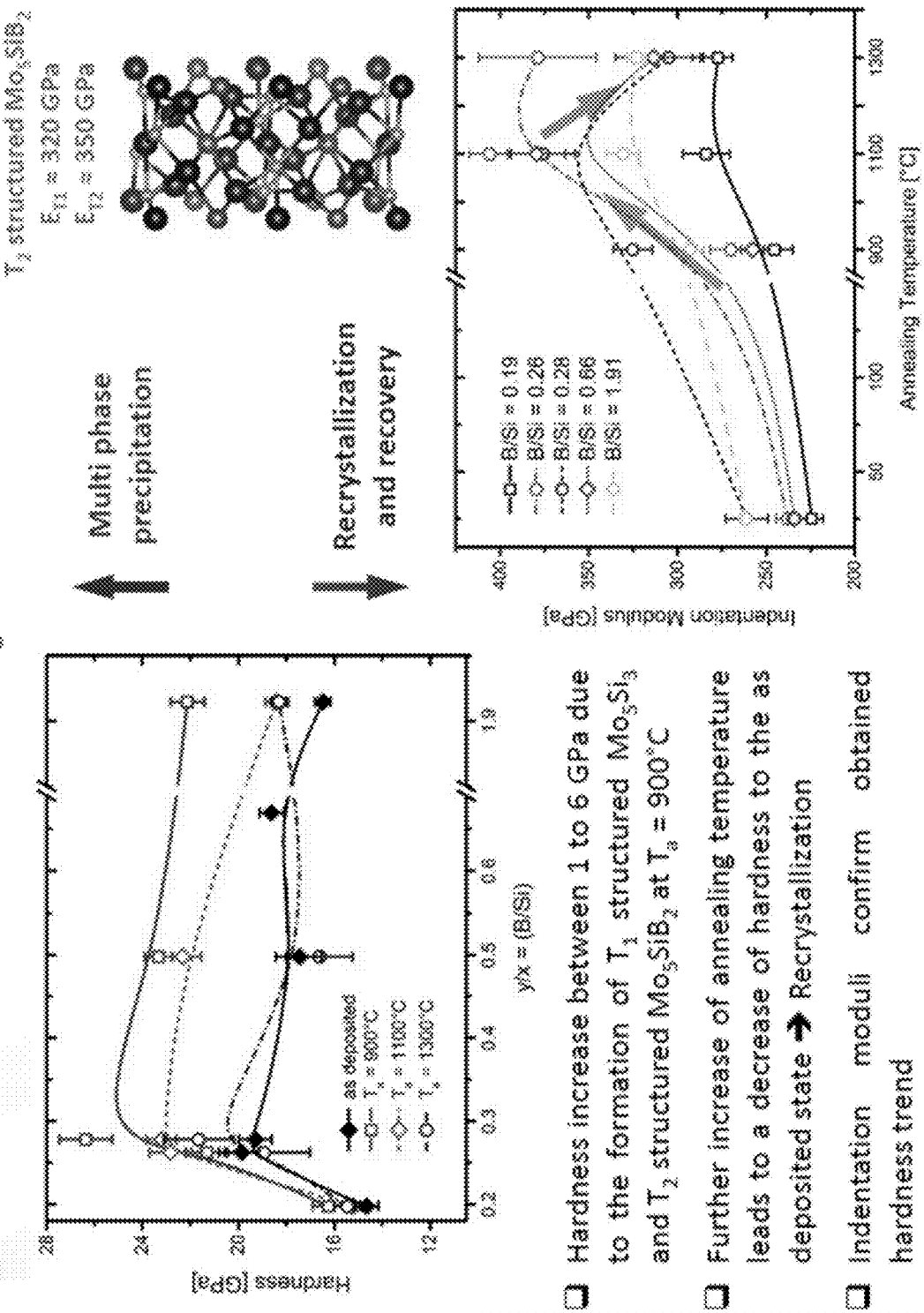

FIG. 7 shows the analysis of the stability of the mechanical properties of the deposited $Mo_{1-x-y}Si_xB_y$ layers after the heat treatments.

Figure 8:
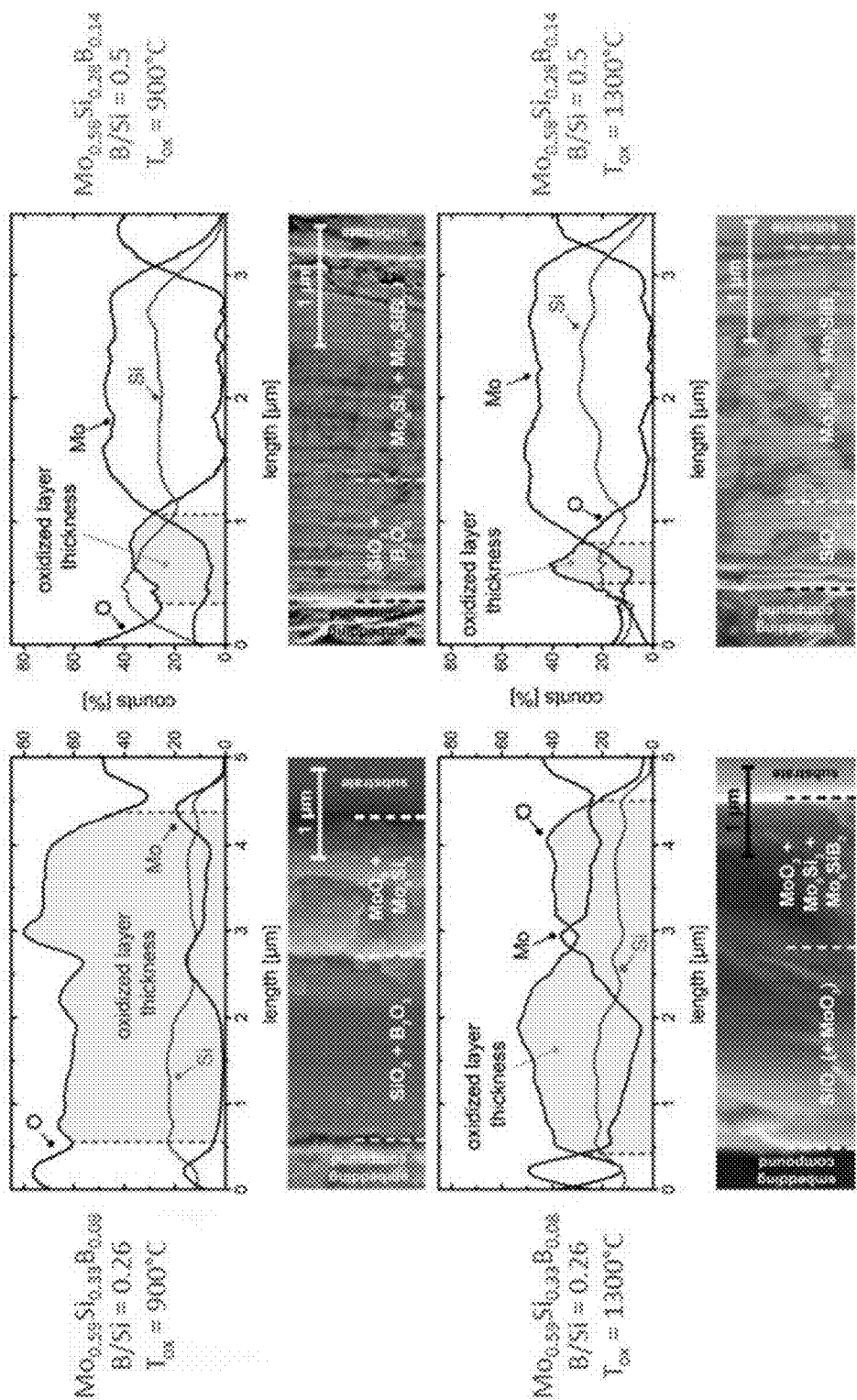

FIG. 8 shows the analysis of the resistance to oxidation of the deposited $Mo_{1-x-y}Si_xB_y$ layers.

FIG. 9 shows a summary of the analyzed layer properties of the deposited $Mo_{1-x-y}Si_xB_y$ layers.

Figure 10:
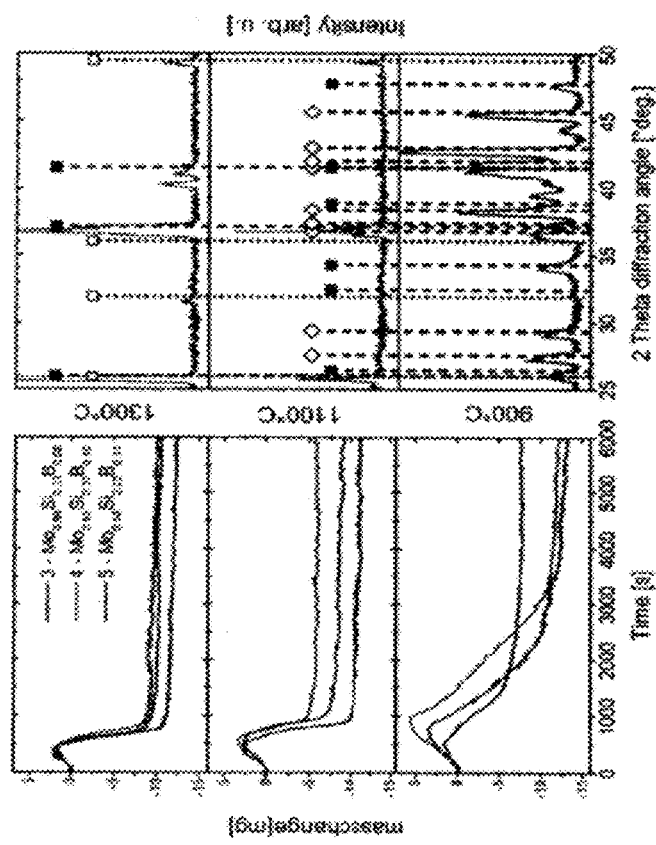

FIG. 10 shows the analysis of the resistance to oxidation of the deposited $Mo_{1-x-y}Si_xB_y$ layers, when they are first pulverized and only afterwards examined as powder.

The invention claimed is:

1. Sputter-coated forming tool with a $Mo_{1-x-y}Si_xB_y$ layer, having a T2 phase, wherein the value of x ranges from 0.28 to 0.37 and the value of y ranges from 0.08 to 0.14.

2. The sputter-coated forming tool of claim 1, wherein the $Mo_{1-x-y}Si_xB_y$ layer has a hardness value in the range of 17.5 to 27 GPa.

3. Method for the production of the $Mo_{1-x-y}Si_xB_y$ layer of claim 1 by magnetron sputtering using a Mo—Si composite target and an elementary B target, wherein the layer is heated to a temperature of at least 900° C. after deposition, whereby the T2 phase is formed.

4. Forming tool with a $Mo_{1-x-y}Si_xB_y$ layer having the T2 phase, wherein the $Mo_{1-x-y}Si_xB_y$ layer was applied onto the surface of a tool by means of a method according to claim 3.

* * * * *